United States Patent [19]

Hayakawa et al.

[11] Patent Number: 4,858,062

[45] Date of Patent: Aug. 15, 1989

[54] CHARGING DEVICE

[75] Inventors: Naoji Hayakawa, Yokohama; Masanori Takenouchi, Atsugi; Kenji Nakamura, Hadano; Fumitaka Kan, Tokyo; Yasuo Kozato, Sagamihara; Isao Hakamada, Yokohama, all of Japan

[73] Assignee: Canon Kabushiki Kaisha, Tokyo, Japan

[21] Appl. No.: 183,517

[22] Filed: Apr. 14, 1988

Related U.S. Application Data

[63] Continuation of Ser. No. 55,512, May 29, 1987, abandoned.

[30] Foreign Application Priority Data

| | | | |
|---|---|---|---|
| Jun. 4, 1986 | [JP] | Japan | 61-128170 |
| Jul. 11, 1986 | [JP] | Japan | 61-162077 |
| Jul. 11, 1986 | [JP] | Japan | 61-162078 |
| Jul. 11, 1986 | [JP] | Japan | 61-162079 |
| Jul. 24, 1986 | [JP] | Japan | 61-174148 |

[51] Int. Cl.$^4$ ....................... H01T 23/00; H01L 29/90

[52] U.S. Cl. .................................... 361/225; 361/229; 361/230; 357/13; 355/219; 346/158; 346/159; 346/161; 250/492.3

[58] Field of Search ........................ 361/225, 229, 230; 355/3 CH; 346/159, 161, 158; 357/13, 23, 53; 313/103 CM, 105 CM, 574

[56] References Cited

U.S. PATENT DOCUMENTS

| | | | |
|---|---|---|---|
| 4,155,093 | 5/1979 | Fotland et al. | 361/229 X |
| 4,259,678 | 3/1981 | van Gorkom et al. | 357/13 |
| 4,303,930 | 12/1981 | van Gorkom et al. | 357/13 |
| 4,472,724 | 9/1984 | Seimiya et al. | 346/159 |
| 4,554,564 | 11/1985 | van Gorkom et al. | 346/161 |
| 4,577,133 | 3/1986 | Wilson | 313/103 CM |
| 4,621,419 | 11/1986 | Nitanda et al. | 355/3 DR |

*Primary Examiner*—L. T. Hix
*Assistant Examiner*—D. Rutledge
*Attorney, Agent, or Firm*—Fitzpatrick, Cella, Harper & Scinto

[57] ABSTRACT

A charging device for forming a latent image of high precision includes plural electron beams generated by plural solid state beam sources, which are independently controlled by plural accelerating electrodes by independently variable voltages.

11 Claims, 12 Drawing Sheets

CHARGING DEVICE

This application is a continuation of application Ser. No. 055,512 filed 5/29/87, now abandoned.

BACKGROUND OF THE INVENTION

1. Field of the Invention

The present invention relates to a charging process and a device thereof, and in particular to a charging device or a latent image forming device utilizing solid-state electron beam generating sources.

2. Related Background Art

Solid-state electron beam generating devices are already disclosed for example in the Japanese Patent Publication No. 30274/1979, Japanese Patent Laid-open Publication No. 111272/1979 (corresponding to the U.S. Pat. No. 4,259,678), Japanese Patent Laid-open Publication No. 15529/1981 (corresponding to the U.S. Pat. No. 4,303,930) and Japanese Patent Laid-open Publication No. 38528/1982.

Such charging, for example that commonly conducted in an electrophotographic process, is conducted usually with a corona charger, and, in the electrophotographic processes, the charging is generally conducted with such a process as to provide a uniform surface potential on a chargeable member such as a photosensitive member.

Also the U.S. Pat. No. 4,155,093 discloses a charging process of selectively charging the surface of a chargeable member, utilizing an electric discharge.

However such conventional charging processes utilizing a corona charge mentioned first are capable of forming a uniform surface potential on the chargeable member but are usable to form a desired charge pattern. Also the charging process mentioned next is unable, due to the characteristics of the charging device, to obtain different surface potentials simultaneously on different positions of the surface of the chargeable member.

Besides such charging devices have not been popularly employed due to various drawbacks such as the requirement of a high control voltage, the destruction of surface elements by sputtering, and a limit in the line density of the charge obtained.

Also in the field of electrostatic latent image forming devices utilizing an electron beam there are already known a so-called thin film penetration printing tube and electrostatic an charge printing tube. However the devices utilizing such tubes are inevitably large since such tubes require a relatively large vacuum space.

Furthermore, in such devices the end portions of the latent image are apt to be distorted, since these tubes rely on the deflection of a single electron beam.

SUMMARY OF THE INVENTION

An object of the present invention is to provide a charging device capable of eliminating such conventional drawbacks as mentioned above.

Another object of the present invention is to provide a charging device capable of obtaining a charge pattern of a very high precision.

Still another object of the present invention is to provide a charging device capable of controlling the amount of charging.

Still another object of the present invention is to provide a compact electrostatic latent image forming device utilizing compact solid-state electron beam sources.

Still another object of the present invention is to provide a device free from registration error which obtain happens when such compact solid-state electron beam sources are employed.

DETAILED DESCRIPTION OF THE PREFERRED EMBODIMENTS

Now the present invention will be clarified in detail by the embodiments thereof shown in the appended drawings.

Figure 1:
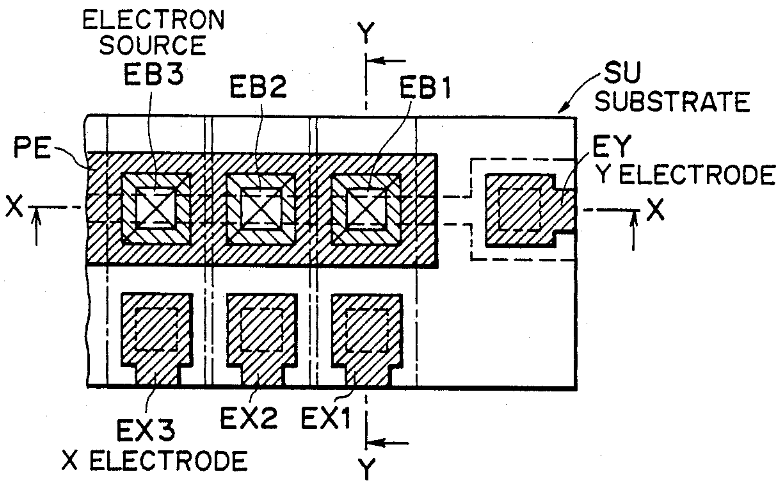
FIG. 1 is a plan view of a charging device embodying the present invention.
Figure 2:
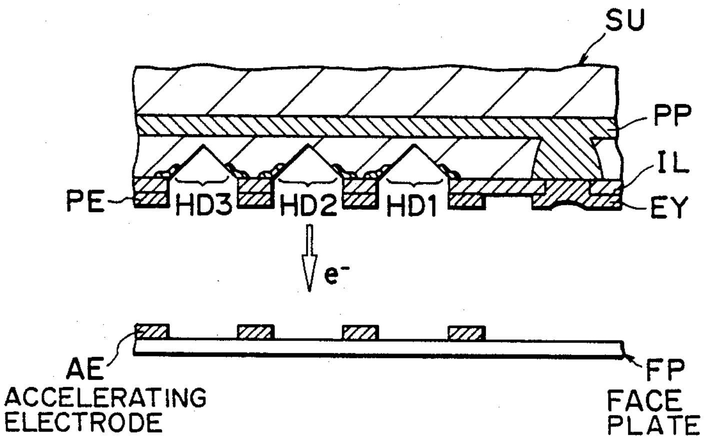
FIGS. 2 and 3 are cross-sectional views respectively along lines X—X and Y—Y in FIG. 1.
Figure 3:
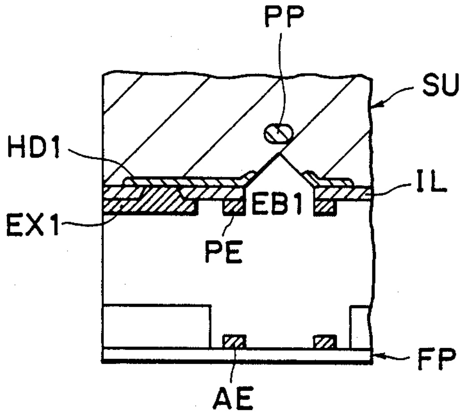

FIGS. 1 to 3 illustrates an embodiment of the present invention, wherein FIG. 1 is a plan view of a charging device, and FIGS. 2 and 3 are cross-sectional views respectively along lines X—X and Y—Y shown in FIG. 1.

A substrate SU constituting plural solid-state electron beam sources EB1, EB2, EB3, . . . is composed, in the present embodiment, of an n-type silicon substrate. X-electrodes EX1, EX2, EX3, . . . for selecting in the X-direction are respectively connected, through contact areas, with high-doped n-type areas HD1, HD2, HD3, . . . A Y-electrode EY, for selecting in the Y-direction, is connected through a contact area with a high-doped p-type area PP. The X- and Y-electrodes constitute a matrix.

On the substrate SU there is provided, across an insulating layer IL, a pulling electrode PE to constitute the electron beam sources EB1, EB2, EB3, . . . Opposed to substrate SU, by means of a spacer of a predetermined thickness, there is provided a thin face plate FP, on which are provided accelerating electrodes AE respectively corresponding to the pulling electrodes PE and which are composed of a metal thin film such as Ni or an electron transmitting material such as a BN or SiC film to form so-called electron windows in the positions corresponding to the electron beam sources EB1, EB2, EB3, . . . Also the face plate FP may be composied of a thin metal film for example of aluminum, serving both as the accelerating electrodes AE and as the electron windows.

In order to accelerate the electrons to a desired energy level, the space between the substrate SU and the face plate FP should be maintained in a vacuum, generally in a pressure range from about $10^{-5}$ to $10^{-9}$ Torr. The substrate SU and the face plate FP are hermetically sealed so as to maintain such pressure therebetween.

In the above-explained structure, a voltage sufficient for causing an electron avalance multiplication at the p-n junction is applied across each of the X-electrodes EX1, EX2, EX3, ... and the Y-electrode EY and a certain voltage is applied to the pulling electrode PE simultaneously. Thus electrons $e^-$ are emitted, as shown in FIG. 2, from the electron beam sources EB1, EB2, EB3, . . .

The electron beam can be obtained arbitrarily from the electron beam sources EB1, EB2, EB3, . . . by suitably selecting the appropriate X-electrodes EX1, EX2, EX3, . . . The mechanism of electron beam generation is explained in detail for example in the U.S. Pat. No. 4,259,678 and will not, therefore, be explained in detail.

The electron beam emitted from each of the electron beam sources EB1, EB2, EB3, . . . is accelerated to desired energy level by a predetermined voltage supplied to the accelerating electrode AE and is transmitted by the electron window of the face plate FP. As an example, in case the electron window is composed of SiC of 1 mm in thickness, 90% of the electrons can be taken out from the device by supplying the accelerating electrode AE with a voltage of 25 kV.

Figure 4:
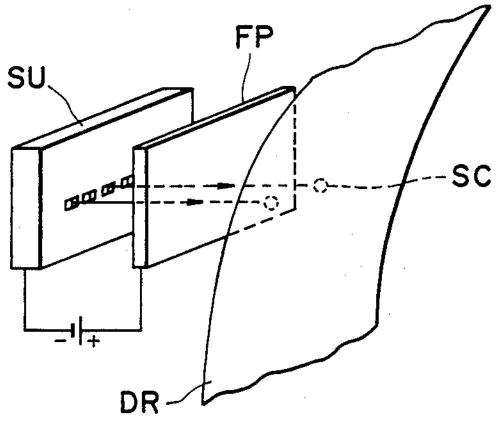
FIG. 4 is a schematic perspective view showing an application of the embodiment shown in FIGS. 1-3.

FIG. 4 is a schematic perspective view of the charging device of the above-described embodiment, applied for example to a dielectric (or a photosensitive drum DR of an electrostatic recording apparatus). Static charge dots SC can be selectively deposited on drum DR, by placing the X-direction of the face plate FP of said charging device parallel to the axis of drum DR. In the present embodiment it has been experimentally confirmed, with a device with electron beam sources arranged in the X-direction with a pitch of 5 $\mu$m, that the dielectric drum DR can obtain ultra-fine charge patterns of a pitch of ca. 5 $\mu$m and that ultra-fine recording and a hard copy of extremely fine tonal rendition can be obtained from this charge patterns.

The electron beam source EB in the foregoing embodiment relies on the electron avalanche multiplication of a p-n junction. However this principle of electron beam generation is not critical in the present invention, so that a similar effect can be achieved with other known solid-state electron beam sources, such as a source utilizing the negative work function of a p-n junction or a method utilizing field emission.

In the foregoing embodiment electron beam sources EB1, EB2, EB3, . . . are arranged as a linear array in the X-direction. It is possible to selectively control the amount of charge of each dot in the charge patterns by independently controlling the electron beam sources, or independently controlling the blocks of the electron beam sources arranged in two-dimensional blocks.

Figure 5:
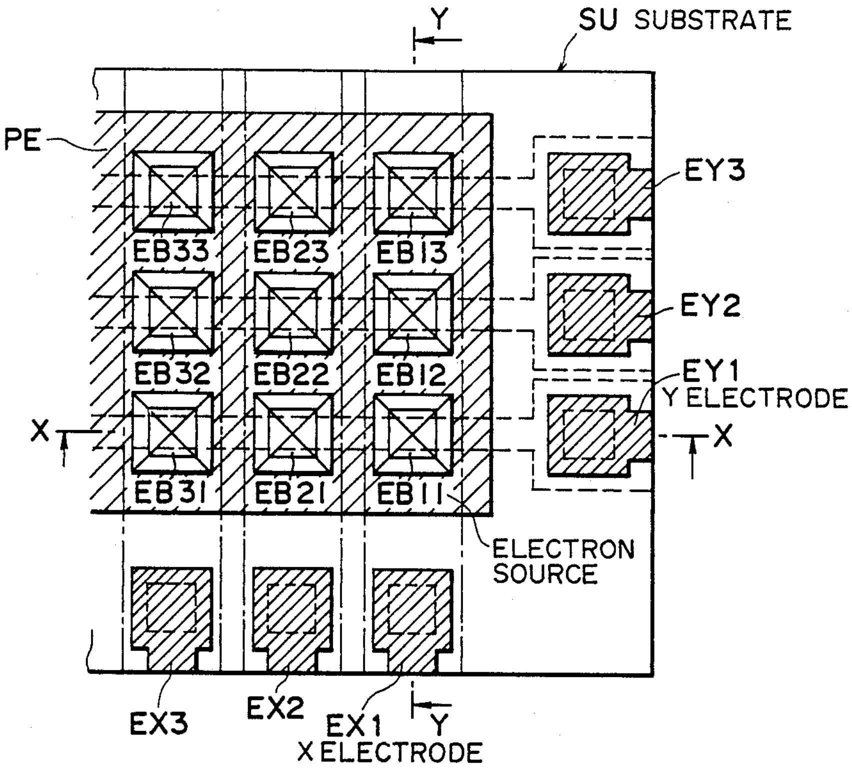
FIG. 5 is a plan view of a substrate of another embodiment of the present invention.
Figure 6:
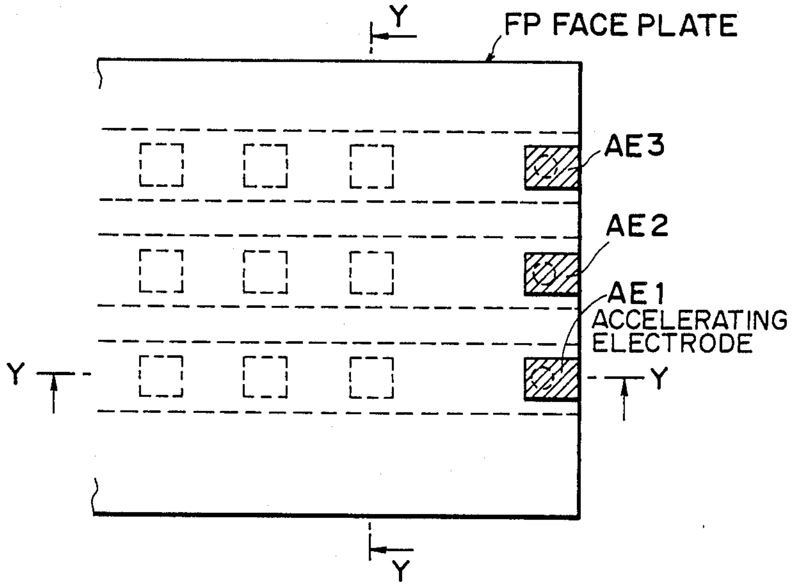
FIG. 6 is a plan view of a surface platen of the present invention.
Figure 7:
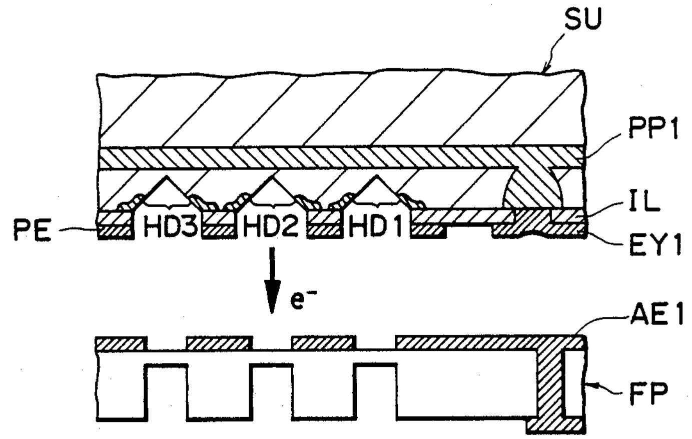
FIGS. 7 and 8 are cross-sectional views respectively along lines X—X and Y—Y in FIG. 5.
Figure 8:
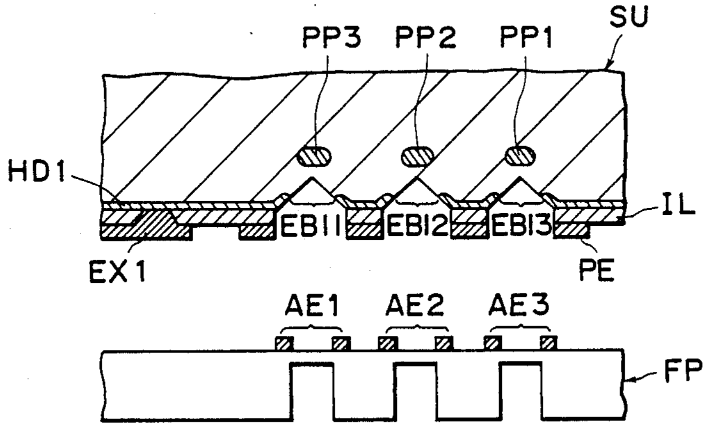

In the following there will be explained another embodiment of the present invention shown in FIGS. 5 to 8, in which FIG. 5 is a plan view of a substrate, FIG. 6 is a plan view of a faceplate, and FIGS. 7 and 8 are cross-sectional views respectively along lines X—X and Y—Y shown in FIG. 5.

In FIGS. 5 to 8, a substrates SU constituting electron beam sources EB11, EB12, EB13, . . . ; EB31, EB32, EB33, . . . (hereinafter collectively referred to as EB1, EB2, EB3, . . . ) is composed, in the present embodiment, of an n-silicon substrate. X-electrodes EX1, EX2, EX3, . . . for making a selection in the X-direction are respectively connected to high-doped n-type areas HD1, HD2, HD3, . . . Also, Y-electrodes EY1, EY2, EY3 for making a selection in the Y-direction are respectively connected, through contact areas like the X-electrodes, to high-doped p-areas PP1, PP2, PP3. In this manner the X-electrodes EX1, EX2, EX3, . . . and the Y-electrodes EY1, EY2, EY3 constitute an X-Y matrix, and the electron beam sources EB1, EB2, EB3, . . . are formed on the crossing points of the matrix. On the substrate SU, and across an insulating layer IL, there is formed a pulling electrode PE. Opposed to the substrate SU, and by means of a spacer of a predetermined thickness there is provided a thin face plate FP on which are provided accelerating electrodes AE1, AE2, AE3.

The area which receive the electron $e^-$ emitted by the electron beam sources EB1, EB2, EB3, . . . is composed of an electron transmissive material with the shaped of a so-called electron window (see FIG. 7). The electron window is preferably composed of a thin metal film such as Ni or a film composed for example of BN or SiC. In order to accelerate the electrons to a desired energy level, the space between the substrate SU and the face plate FP has to be maintained in vacuum state, generally in a pressure range from about $10^{-5}$ to $10^{-9}$ Torr. The substrate SU and the face plate FP are hermetically sealed to maintain such a vacuum therebetween. In addition barium getter, usually employed in electronic vacuum tubes, may be sealed therein to improve the hermeticity.

In the above-explained structure, a voltage Vc, sufficient for causing an electron avalanche multiplication at the p-n junction of each of the electron beam sources EB1, EB2, EB3, . . . , across each of the X-electrodes EX1, EX2, EX3, . . . and each of the Y-electrodes EY1, EY2, EY3, and a certain voltage Vp ($Vp > Vc$) is applied to the pulling electrode PE to emit electrons $e^-$ from electron beam sources EB1, EB2, EB3. Since the X-electrodes EX1, EX2, EX3, . . . and the Y-electrodes EY1, EY2, EY3 constitute an X-Y matrix as explained before, the electron beams can be obtained from arbitrary electron beam sources by suitably selecting the appropriate X- and Y-electrodes.

For example, an electron beam can be obtained from the electron beam source EB12 by applying the voltage Vc across the X-electrode EX1 and the Y-electrode EY2. By applying predetermined voltages to the accelerating electrodes AE1, AE2, AE3, the electrons emitted from the electron beam sources EB are accelerated to desired energy levels and are transmitted by the electron windows. As an example, an electron window composed of SiC of 1 μm in thickness allows one to take out 90% of the electrons from the charging device with a voltage of 25 kV applied to the accelerating electrodes AE.

Figure 9:
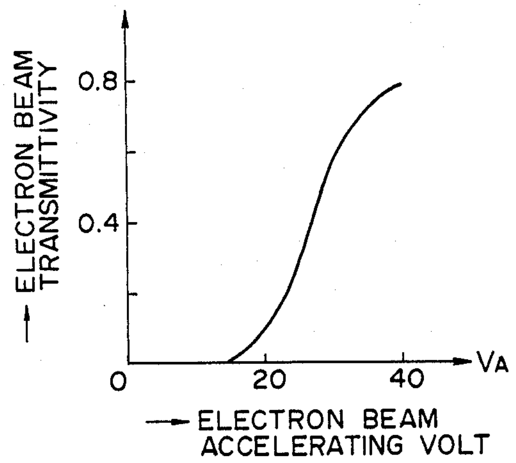
FIG. 9 is a chart showing the relation between the accelerating voltage and the electron beam transmission.

FIG. 9 is a chart showing the relation in the present embodiment between the voltage $V_A$ applied to the accelerating electrode AE and the electron beam transmittance, obtained with electron windows composed of a Ni film of 1 μm in thickness, where the face plate FP, composed of Ni film, is adhered on a slit-shaped structure for withstanding the atmospheric pressure.

Figure 10:
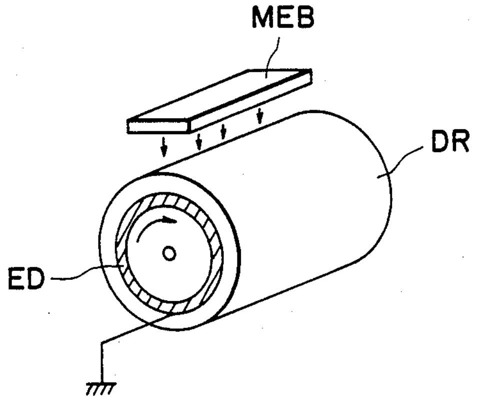
FIG. 10 is a perspective view of another embodiment of the present invention.

FIG. 10 is a perspective view showing an application of the present invention to an electrophotographic process, in which the above-explained charging device MEB is positioned opposed to a dielectric drum DR composed of an aluminum cylinder ED covered with a dielectric layer of PET (polyethylene terephthalate) film, wherein the X-direction of the charging device is positioned parallel to the axis of the cylinder, for charging the surface of the drum DR.

In the above application the following relation is satisfied $\phi 1 < \phi 2 < \phi 3$, when the surface potential of the drum DR is represented by $-\phi 1$ when the voltage Vc is applied across the X-electrode EX1 and the Y-electrode EY1, the surface potential of the drum DR is represented by $-\phi 2$ when the voltage is applied across EX1 and EY2, and the surface potential of the drum DR is represented by $-\phi 3$ when the voltage is applied across EX1 and EY3. In this manner the amount of charge can be controlled in three levels by selecting the Y-electrodes EY1, EY2, EY3.

Thus an arbitrary charge pattern can be formed on the drum DR, by suitably selecting the X-electrodes EX1, EX2, EX3, . . . and the Y-electrodes EY1, EY2, EY3 while the drum DR is rotated.

In the foregoing embodiment the electron beam sources rely on the electron avalanche multiplication of a p-n junction. However the mechanism of electron beam emission is not critical in the present invention, and a similar effect can be achieved with other known solid-state electron beam sources, such as a utilizing the negative workfunction of a p-n junction or a device utilizing a field emission effect.

However the foregoing embodiment is usable to control the amount of charging in the same position. The electron beams emitted for example from the beam sources EB1 (EB11, EB12, EB13, . . . ) are directed to different positions on the drum DR (FIG. 10), so that it is not possible to vary the amount of charge in a given position even by regulating the voltages supplied to the accelerating electrodes AE1, AE2, AE3. This problem can however be solved by a substrate SU shown in FIG. 11.

Figure 11:
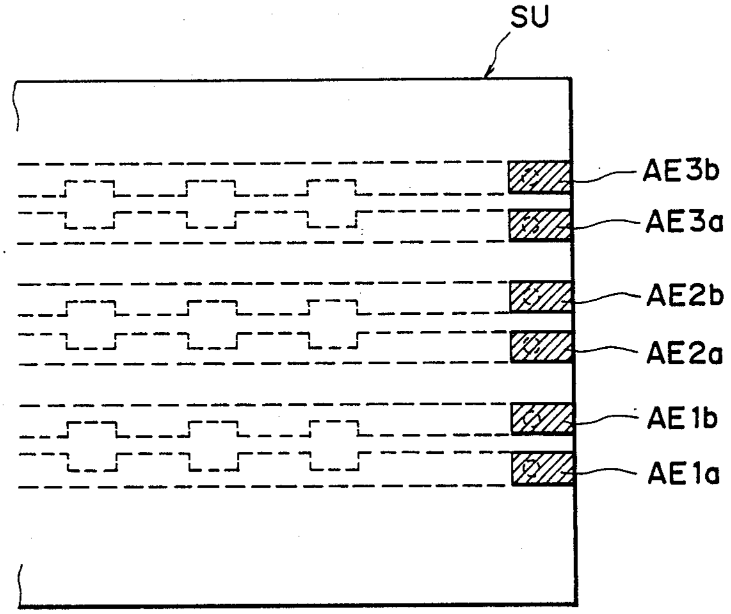
FIG. 11 is a plan view of another embodiment of the substrate.

FIG. 11 is a plan view of accelerating electrodes AE on the substrate SU, wherein each accelerating electrode is composed of a pair of electrodes, as represented by AE1*a*, AE1*b*; AE2*a*, AE2*b*; AE3*a*, AE3*b*, and the electron beam can be deflected by forming a voltage different between the electrodes a and b.

Figure 12:
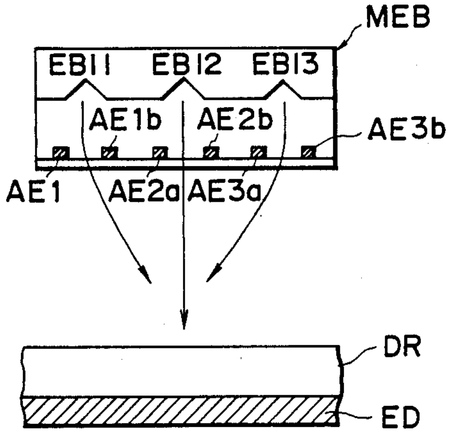
FIG. 12 is a schematic view showing an application of the substrate shown in FIG. 11.

For example the electorn beams emitted from the electron beam sources EB11, EB12, EB13 of the charging device MEB can be converged to the same point of the dielectric drum DR (FIG. 10), as shown in FIG. 12, by supplying the electrode AE1*a* with a voltage V1, the electrode AE1*b* with a voltage (V1+ΔV1), the electrodes AE2*a* and AE2*b* with a voltage V2, the electrode AE3*a* with a voltage (V3+ΔV3) and the electrode AE3*b* with a voltage V3. The amount of charge on each point on the dielectric drum DR can be controlled in three levels by means of the charging device MEB of the above-explained structure.

The foregoing embodiment employs three sets of the accelerating electrodes AE, but it is also possible to control the amount of charge in n levels by employing n×m electron beam sources and m sets of the accelerating electrodes.

The charging process in any of the foregoing embodiments is capable of forming an arbitrary charge pattern on a chargeable member, and a hard copy can be obtained by utilizing the charge pattern as an electrostatic latent image in n electrophotographic process, rendering the image visible by depositing developed such as toner powder and thus obtaining a visible image onto a plain paper sheet. An image with ideal tonal rendition can be obtained since the amount of charge can be controlled in each dot.

The solid-state electron beam sources in any of the foregoing embodiments can be integrated by a high density as they can be produced with so-called semiconductor process, and can therefore achieve a recording of ultra-high precision which could not be achieved in the conventional technology, when employed in the electrophotographic process.

Figure 13:
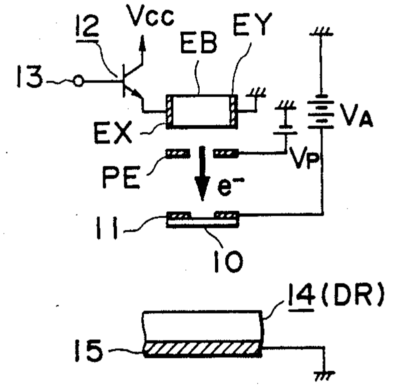
FIG. 13 is a schematic view showing the concept of control employed in the present invention.
Figure 14:
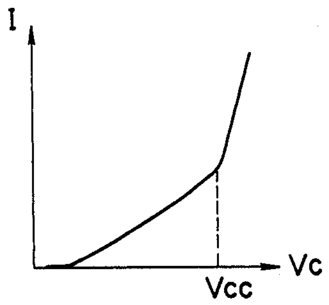
FIG. 14 is a chart showing a characteristic of an electron beam source.

FIG. 13 shows the concept of control in the charging process of the present invention, utilizing the above-explained charging device. A control switch 12 is provided for each electron beam source EB. FIG. 14 shows the relationship between the voltage Vc applied across the X-electrode EX and the Y-electrode EY, and the current I flowing out from the electron beam source EB. Thus the electron beam source can be turned on and off by switching a predetermined supply voltage Vcc with control switch 12. Consequently the amount of charge on the dielectric drum 14 can be controlled by supplying a control terminal 13 for controlling the switch 12, with voltage pulses shown in FIG. 15. In such operation it is necessary to select the voltage VP, supplied to the pulling electrode PE, to be larger than the voltage Vcc applied across the X-electrode EX and the Y-electrode EY (VP>Vcc), and to select the voltage VA, supplied to the accelerating electrode 11, so as to supply the electrons emitted by the electron beam sources EB with an energy sufficient for getting out of the charging device.

Figure 15:
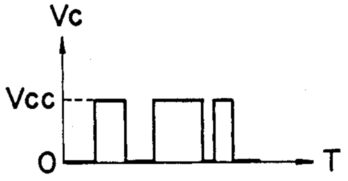
FIG. 15 is a wave from chart of a control signal.
Figure 16:
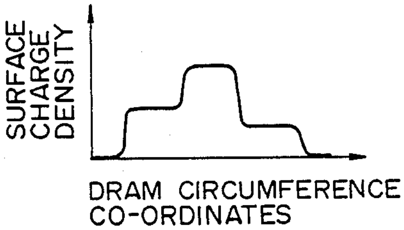
FIG. 16 is a chart showing the surface charge density distribution on a chargeable member.
Figure 17:
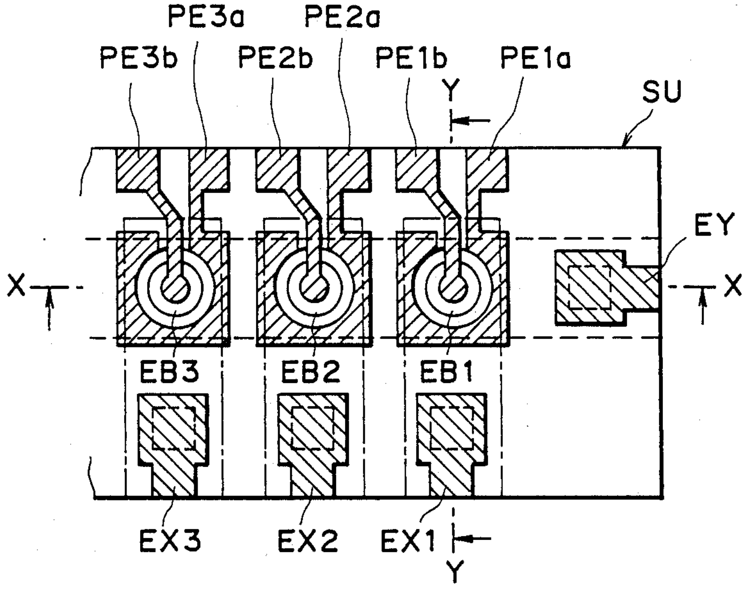
FIG. 17 is a plan view of a substrate of another embodiment of the present invention.
Figure 18:
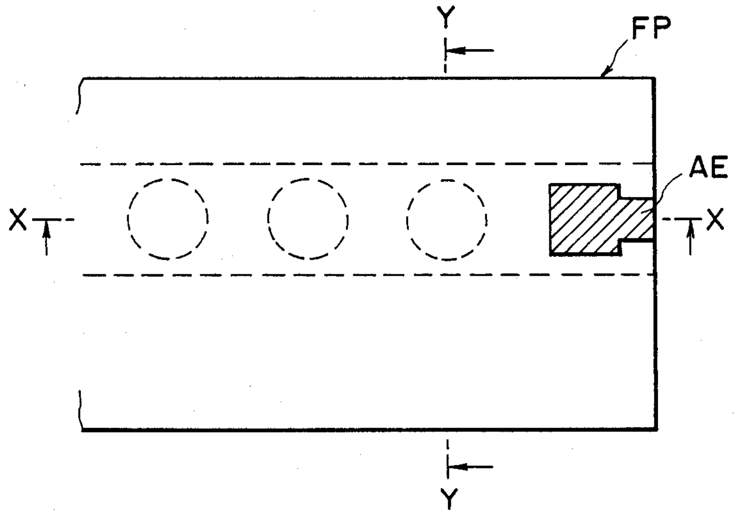
FIG. 18 is a plan view of a surface plate of the present invention.
Figure 19:
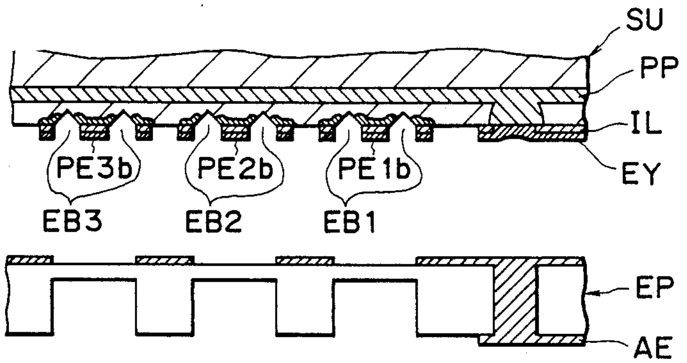
FIG. 19 and 20 are cross-sectional views respectively along lines X—X and Y—Y in FIG. 17.
Figure 20:
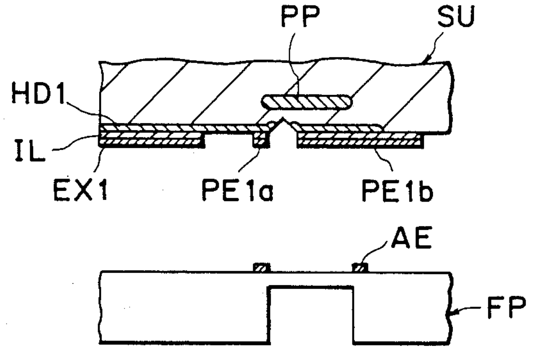

As shown in FIG. 10, the solid-state charging device is positioned opposite to a dielectric drum 14, composed of an aluminum cylinder covered for example with polyethylene terephthalate, and pulses of a voltage Vcc as shown in FIG. 15 are supplied to the control terminal 13 shown in FIG. 13 while the dielectric drum is rotated. In this manner a surface charge distribution as shown in FIG. 16 can be obtained on the chargeable member covering the surface of the dielectric drum. An arbitrary charge pattern can be obtained on the chargeable member by independently controlling the control terminals 13.

In the above-explained solid electron beam generating device, the arbitrary X-electrodes EX are selected by independently controlling the corresponding control terminals 13 in the plural X-electrodes arranged on the substrate SU in the predetermined direction, and are respectively given independently time-modulated voltages Vc. Simultaneously the pulling electrode PE provided on the substrate SU is given a predetermined voltage to emit the electrons from selected ones of the plural electron beam surfaces EB formed on the substrate SU. Also the accelerating electrodes AE provided on the face plate FP (10) are given a predetermined voltage to accelerate the electrons in a substantially vacuum space between the substrate SU and the opposed face plate FP and to cause the electrons to pass through the face plate FP composed of the electron transitting material. The electrons having passed said face plate FP are directed to the dielectric drum DR rotated at a predetermined speed and charge the chargeable member provided thereon. On the chargeable member there is obtained a charge density distribution corresponding to the time-modulated voltages independently supplied to the plural X-electrodes.

The electron beam sources of the present embodiment rely on the electron avalanche multiplication of a p-n junction. However the mechanism of electron emission in the present embodiment is not critical, and a similar effect can be obtained also with other solid-state electron beam sources, such as the source utilizing negative work function of a p-n junction or the source utilizing field emission.

Also, the present embodiment controls the electron density emitted from the electron beam sources EB by the time modulation of the voltage Vc applied to the p-n junction, but a similar effect can also be obtained by time modulation of the voltage Vp supplied to the pulling electrode PE. In this case, however, it is necessary to provide plural pulling electrodes PE in a similar manner as the X-electrodes in the foregoing embodiment and to independently control the plural pulling electrodes.

Besides the present embodiment employs a linear array of the electron beam sources, but the charging can be conducted in a similar manner with two-dimensionally arranged electron beam sources, which are divided into plural blocks and are provided respectively with control electrodes in the blocks.

In this manner an arbitrary charge pattern can be obtained on the chargeable member through independent control of the control terminals. Also a hard copy can be obtained by utilizing the thus formed charge pattern as an electrostatic latent image, rendering the image visible by depositing toner powder and transferring the thus obtained visible image onto a plain paper sheet.

Also an ideal tonal rendition can be obtained in the recording, as the amount of charge can be controlled in each dot.

The charging device of the present invention can achieve a high integration of the electron beam sources as can be produced with a semiconductor process, and can therefore provide ultrafine recording.

In the following there will be explained still another embodiment shown in FIGS. 17 to 21, wherein same components as those in FIG. 1 are represented by same symbols or numbers.

In the present embodiment the pulling electrodes PE constitute electron lenses. The pulling electrodes PE1*a*, PE1*b*; PE2*a*, PE2*b*; PE3*a*, PE3*b*, . . . are formed in pairs, and a potential difference of each pair can distort and/or deflect the cylindrical electron beam emitted from each electron beam source EB, thus converging the same to a desired point.

Figures 21A, 21B:
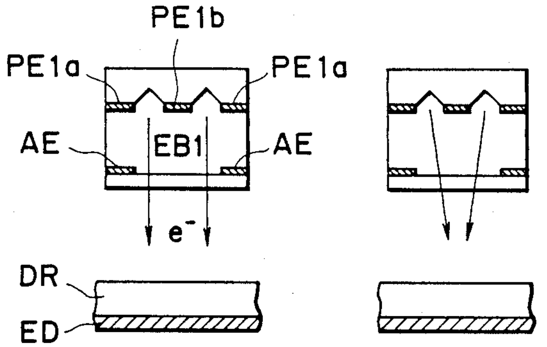
FIG. 21A and 21B are schematic views showing the lens function of the pulling electrode employed in the present invention.

FIG. 21 schematically illustrates the lens function of each pair of the pulling electrodes PE. It is assumed that the voltage supplied to the pulling electrode PE1a is Vpl, and that supplied to the electrode PE1b is $(Vpl+\Delta V)$. In case of $\Delta V=0$, the electron beam emitted by the source EB1 becomes almost parallel as shown in FIG. 21(A). However, by suitable selection of the value of $\Delta V$, the electron beam can be concentrated substantially on a point on the dielectric drum DR shown in FIG. 20. Thus the regulation of $\Delta V$ varies the diameter of the electron beam spot on the drum DR, thus varying the surface charge density thereon.

FIG. 10 is a perspective view in which the above-explained charging device MEB is positioned opposite to a dielectric drum DR composed of an aluminum cylinder ED covered with a dielectric layer for example of polyethylene terephthalate, with the X-direction of the device parallel to the axis of the drum, for charging the surface of drum DR for example for use in an electrophotographic process.

A desired charge pattern can be formed on the drum DR by arbitrarily selecting the X-electrodes EX1, EX2, EX3, . . . while drum DR is rotated. Also control means may be provided for selecting the voltage supplied to the pulling electrode PE for each electron beam source EB, thereby controlling the amount of charge for each dot.

The electron beam sources EB in the forgoing embodiment rely on the electron avalance multiplication of a p-n junction. However, the mechanism of electron beam generating is not critical in the present invention, and a similar effect can be achieved with other solid-state electron beam sources such as a device utilizing the negative work function of a p-n junction or a device utilizing the field emission.

In the foregoing embodiment each pulling electrode is provided with a lens function, but the charging process of the present invention can be realized by providing each accelerating electrode AE with such electron lens function.

Figure 22:
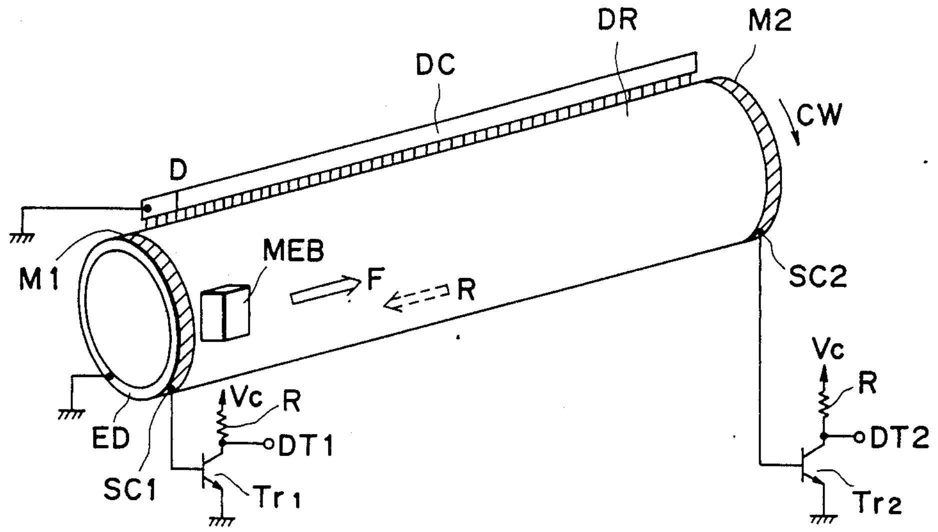
FIG. 22 is a perspective view of another embodiment of the present invention.

As shown in FIG. 22, the charging device MEB is positioned opposite to a dielectric drum DR serving as a latent image bearing member, composed of a metal cylinder ED covered with a dielectric layer D, and an electrostatic latent image is formed by moving the charging device MEB toward right while the drum DR is stepwise rotated in a direction CW. DC indicates a charge eliminator. In such case, in order to detect the home position of the charging device MEB, conductive layers M1, M2 are provided on at least one of the non-image end areas of the dielectric drum. When the charging device MEB reaches conductive layer M1 or M2, the current from the device provides an output signal DT1 or DT2. CS1 and CS2 indicate sliding contacts.

Figure 23:
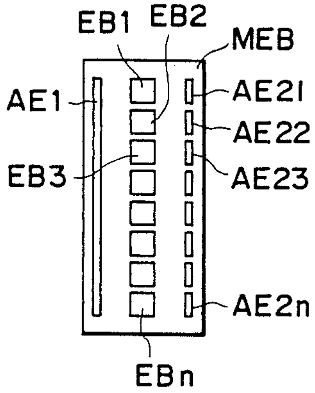
FIGS. 23 and 24 are schematic views showing examples of the arrangement of the solid-state electron beam sources.
Figure 24:
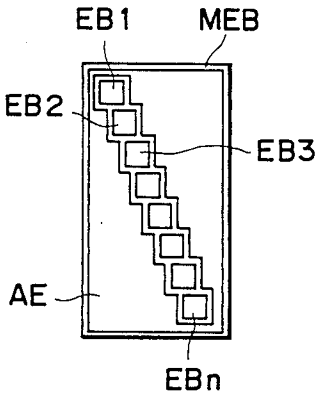

FIGS. 23 and 24 show examples of the arrangement of the electron beam sources EB1–EBn to be employed in the mechanism shown in FIG. 22.

In the structure shown in FIG. 23, the electron beams are preferably emitted simultaneously from the sources EB1–EBn. However, if the electron beams are emitted in succession for example in consideration of heat generation, a compensation becomes necessary because the charging device MEB is moved relative to the dielectric drum DR. This compensation is achieved by deflecting the electron beams by supplying the accelerating electrodes AE1, AE21–AE2n with accelerating voltages as shown in FIG. 25.

Figure 25:
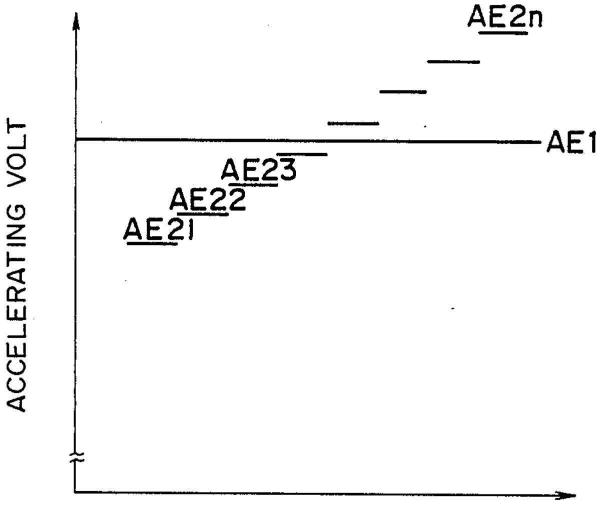
FIG. 25 is a chart showing an example of voltages supplied to the accelerating electrodes of the charging device utilizing solid-state electron beam sources.
Figure 26:
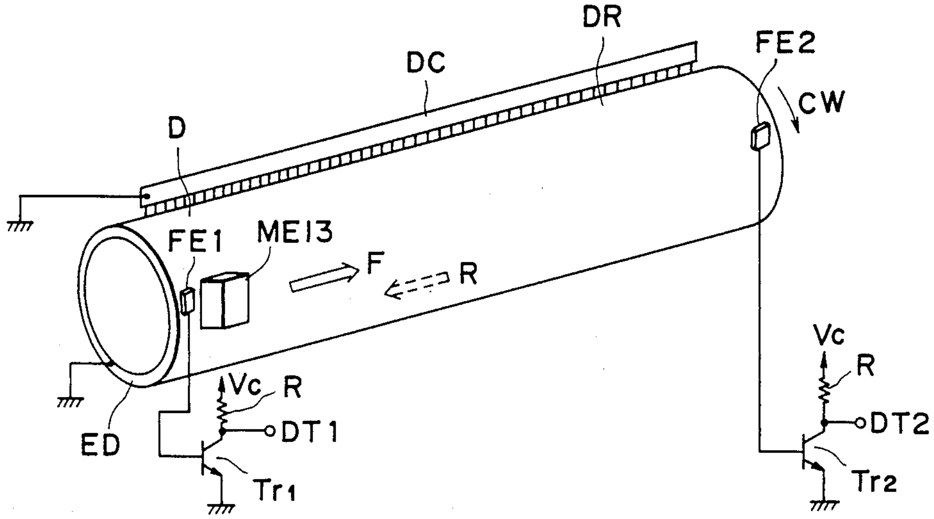
FIG. 26 is a perspective view of another embodiment of the present invention.

The voltages shown in FIG. 25 can be regulated to match various moving speeds. Also, if the moving speed of the charging device MEB is constant, the sources EB1–EBn may be positioned stepwise as shown in FIG. 24. In such case there may be employed a single accelerating electrode. The conductive area in the non-image area need not necessarily be positioned on the drum DR, and separate conductive members FE1, FE2 may be employed for this purpose as shown in FIG. 26.

Figure 27:
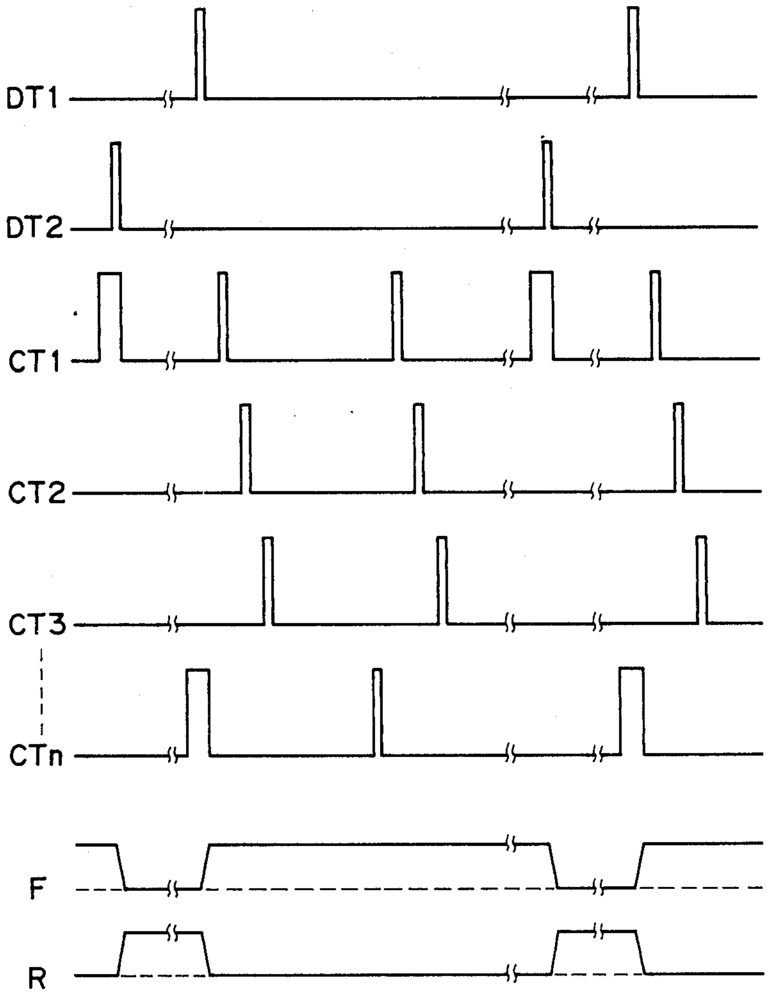
FIG. 27 is a timing chart showing an example of the control signal.

Now reference is made to FIG. 27 for explaining the timing of the home position detection signals DT1, DT2 and of the supply of image information to CT1–CTn.

A signal is supplied to CT1 when the charging device MEB reaches the vicinity of an inverting position M2 shown in FIG. 22, and there is detected a current DT2 generated by the electron beam from the source EB1. In response the moving direction of the charging device MEB is inverted from F to R. Then a signal is supplied to CTn when the device MEB reaches the vicinity of the home position M1, and the moving direction of the device MEB is changed from R to F upon detection of a current DT1 generated by the electron beam from the source EBn. During the movement of the charging device MEB in the direction F, image signals are supplied in succession to CT1–CTn, thereby forming an electrostatic latent image on the dielectric drum DR.

A visible image can be obtained, from the above-explained latent image forming device of the present invention, by means of ordinary image development, for example magnetic brush development or liquid development already known in the conventional electrophotographic processes.

The electron beam sources employed in the foregoing embodiment rely on the electron avalanche multiplication of a p-n junction. However the mechanism of electron beam generation is not critical in the present invention, and a similar effect can be obtained with other solid-state electron beam sources, such as a device utilizing the negative work function of a p-n junction or a device utilizing field emission.

It is also possible to obtain a halftone latent image, in the foregoing embodiment, by time modulation of the voltage supplied to the p-n junction, thereby controlling the electron density emitted from each electron beam source. It is also possible to utilize time modulation of the voltage supplied to the pulling electrode PE. In such case, however, it is necessary to employ plural pulling electrodes PEn (n=1, 2, 3, . . . ) and to control the plural pulling electrodes independently.

As explained in the foregoing, it is rendered possible to obtain an electrostatic latent image forming device utilizing compact electron beam sources, and to obtain a latent image of high image quality, which is free from registration errors which are often encountered when a compact electron beam source is employed is a moving fashion.

What is claimed is:

1. A charging process for charging the surface of a chargeable member comprising the steps of: irradiating said surface with electron beams emitted by a solid-state electron beam generating means provided with plural electron beam sources; pulling said electron beams using a plurality of first electrodes of said solid-state electron beams generating means; accelerating the electrons of said electron beams pulled by said first electrodes using a plurality of second electrodes of said solid state electron beam generating means to take said electron beams outside a vacuum; and controlling the charges deposited on the surface of said chargeable member by charging voltages supplied to said second electrodes, independently of each other.

2. A charging process according to claim 1, wherein said solid-state electron beam generating means comprises a substrate provided with plural electron beam sources thereon and a thin plate positioned opposite to said substrate with a predetermined distance therebetween, wherein the space therebetween is hermetically sealed to maintain said space subtantially vacuum, and wherein said thin plate is partially composed of an electron transmissive material and is provided thereon with said second electrodes to apply predetermined voltages across said plural electron beam sources thereby accelerating the electrons emitted by said plural electron beam sources to release said electrons from said solid-state electron beam generating emans to the outside.

3. A charging device comprising: a substrate provided thereon with plural solid-state electron beam sources and a plurality of first electrodes for pulling electron beams, and a thin plate positioned opposite to said substrate with a predetermined distance therebetween, with the space therebetween being hermetically sealed to maintain said space substantially vacuum, wherein said thin plate further comprises an electron transmissive member and second electrodes for applying controllable voltages across said plural solid-state electron beam sources and said second electrodes, thereby accelerating the electrons emitted by said plural solid-state electron beam sources and releasing said electrons from said charging device to the non-vacuum outside.

4. A charging device according to claim 3, wherein a charging operation is selectively performed by controlling said plural solid-state electron beam sources independently of each other.

5. A charging process according to claim 3 further comprising plural sets of electrodes respectively constituting electron lenses, and wherein the charges deposited on the surface of said chargeable member are controlled by independent changes of voltages supplied to said plural sets of electrodes.

6. An electrostatic latent image forming apparatus comprising a latent image bearing member and a charging device movable in a direction substantially perpendicularly to the moving direction of said latent image bearing member, said charging device comprising a substrate having a plurality of solid-state electron beam sources and a plurality of first electrodes for pulling electron beams, and a thin plate positioned opposite to said substrate with a predetermined distance therebetween, with the space therebetween being hermetically sealed to maintain said space substantially vacuum, wherein said thin plate further comprises an electron transmissive member and second electrodes for applying controllable voltages across said plurality of electron beam sources and said second electrodes, thereby accelerating the electrons emitted by said plurality of electron beam sources and releasing said electrons from said charging device to the non-vacuum outside.

7. An electrostatic latent image forming apparatus according to claim 6, further comprising means for deflecting the plurality of solid-state electron beams from said electron beam sources according to the moving speed thereof, in successive activation of said electron beam sources.

8. A charging process for charging the surface of a chargeable member comprising the steps of: irradiating said surface with electron beams emitted by solid-state electron beam generating means provided with plural electron beam sources; pulling said electron beams using a plurality of first electrodes; controlling the density of the electrons emitted by said plurality electron beam sources of said solid-state electron beam generating means to control the charges deposited on the surface of said chargeable member; thereby controlling said electron density by independent time modulation of voltages supplied to said plurality of first plural electrodes.

9. A charging process according to claim 8, wherein said plurality of first electrodes are selectable in a predetermined direction, and the charges deposited on the surface of the chargeable member are controlled by independent time modulation of the voltages supplied to said plurality of first electrodes selectable in a predetermined direction.

10. A charging process according to claim 8, wherein said plurality of first electrodes are plural pulling electrodes for emitting electrons from plural electron beam sources, and the charges deposited on the surface of the chargeable member are controlled by independent time modulation of the voltages supplied to said plural pulling electrodes.

11. A charging process according to claim 8, wherein said solid-state electron beam generating means comprises a substrate provided thereon with plural electron beam sources, and a face plate positioned opposite to said substrate with a predetermined distance therebetween, wherein the space between said face plate and said substrate is hermetically sealed to maintain said space substantially vacuum, and wherein said face plate is partially composed of an electron transmitting member and is provided with a plurality of second electrodes for applying predetermined voltages across said electrodes and said plural electron beam sources, thereby accelerating the electrons emitted by said plural electron beam sources and releasing said electrons to the outside.

* * * * *

UNITED STATES PATENT AND TRADEMARK OFFICE

CERTIFICATE OF CORRECTION

PATENT NO. : 4,858,062

DATED : August 15, 1989

INVENTOR(S) : Hayakawa, et al.

It is certified that error appears in the above-identified patent and that said Letters Patent is hereby corrected as shown below:

On the title page:

AT [56]:

Change "4,621,419" to read --4,621,919--.

AT [57]:

Line 3, change "solid state" to --solid-state--.

COLUMN 1:

Line 35, change "usable" to read --unable--.

Line 48, change "electrostatic an" to read --an electrostatic--.

COLUMN 2:

Line 3, change "obtain" to read --often--.

Line 15, change "platen" to read --plate--.

Line 62, change "illustrates" to read --illustrate--.

COLUMN 3:

Line 20, change "composied" to read --composed--.

Line 66, change "this" to read --these--.

UNITED STATES PATENT AND TRADEMARK OFFICE

CERTIFICATE OF CORRECTION

PATENT NO. : 4,858,062 Page 2 of 4

DATED : August 15, 1989

INVENTOR(S) : Hayakawa, et al.

It is certified that error appears in the above-identified patent and that said Letters Patent is hereby corrected as shown below:

COLUMN 4:

Line 20, change "substrates" to read --substrate--.

Line 41, change "electron" to read --electrons--.

COLUMN 5:

Line 50, delete "a".

Line 51, change "workfunction" to read --work function--.

Line 53, change "usable" to read --unable--.

Line 68, change "different" to read --difference--.

COLUMN 6:

Line 1, change "electorn" to read --electron--.

Line 22, change "n" to read --an--.

Line 23, change "developed" to read --developer--.

COLUMN 7:

Line 10, change "surfaces" to read --sources--.

Line 17, change "transitting" to read --transmitting--.

UNITED STATES PATENT AND TRADEMARK OFFICE

CERTIFICATE OF CORRECTION

PATENT NO. 4,858,062

DATED August 15, 1989

INVENTOR(S) Hayakawa, et al.

It is certified that error appears in the above-identified patent and that said Letters Patent is hereby corrected as shown below:

COLUMN 8:

Line 59, change "CS1 and CS2" to read --SC1 and SC2--.

COLUMN 9:

Line 59, change "is" (second occurrence) to read --in--.

Line 68, change "beams" to read --beam--.

COLUMN 10:

Line 3, change "solid stati" to read --solid-state--.

Line 14, change "subtantially" to read --substantially--.

Line 21, change "emans" to read --means--.

Line 41, change "claim 3" to read --claim 3,--.

Line 67, delete "plurality of solid-state".

Line 68, before "electron" insert --plurality of solid-state--.

UNITED STATES PATENT AND TRADEMARK OFFICE
CERTIFICATE OF CORRECTION

PATENT NO. 4,858,062

DATED August 15, 1989

INVENTOR(S) Hayakawa, et al.

It is certified that error appears in the above-identified patent and that said Letters Patent is hereby corrected as shown below:

COLUMN 11:

Line 1, change "elec-" to read --plurality of solid-state--.

Line 9, change "plurality" to read --plural--.

Line 14, delete "plural".

FIGURE 16:

Change "DRAM" to read --DRUM--.

Signed and Sealed this

Fourth Day of June, 1991

Attest:

HARRY F. MANBECK, JR.

Attesting Officer

Commissioner of Patents and Trademarks